United States Patent [19]
Bothra

[11] Patent Number: 6,080,661
[45] Date of Patent: Jun. 27, 2000

[54] METHODS FOR FABRICATING GATE AND DIFFUSION CONTACTS IN SELF-ALIGNED CONTACT PROCESSES

[75] Inventor: Subhas Bothra, San Jose, Calif.

[73] Assignee: Philips Electronics North America Corp., New York, N.Y.

[21] Appl. No.: 09/087,441

[22] Filed: May 29, 1998

[51] Int. Cl.⁷ .............................................. H01L 21/4763
[52] U.S. Cl. ......................... 438/637; 438/233; 438/634; 438/702
[58] Field of Search ................................... 438/637, 634, 438/636, 700, 233, 702, 945

[56] References Cited

U.S. PATENT DOCUMENTS

| | | | |
|---|---|---|---|
| 3,792,319 | 2/1974 | Tsange | 317/235 R |
| 4,042,950 | 8/1977 | Price | 357/51 |
| 4,966,870 | 10/1990 | Barber et al. | |
| 5,397,722 | 3/1995 | Bashir et al. | 437/41 |
| 5,413,969 | 5/1995 | Huang | 437/200 |
| 5,468,342 | 11/1995 | Nulty et al. | |
| 5,547,881 | 8/1996 | Wang et al. | 437/24 |
| 5,578,523 | 11/1996 | Fiordalice et al. | |
| 5,605,854 | 2/1997 | Yoo | 437/44 |

OTHER PUBLICATIONS

Unknown, "*Advanced Interconnection and Contact Schemes Based on TiSi₂ and CoSi₂: Relevant Materials Issues and Technological Implementation*", Jun. 1988, pp. 144–153, Imec, Katholieke Universiteit Leuven.

*Primary Examiner*—Caridad Everhart
*Attorney, Agent, or Firm*—Martine Penilla & Kim, LLP

[57] ABSTRACT

Disclosed are methods for making reliable conductive vias in semiconductor devices that are fabricated over a semiconductor wafer. The semiconductor device includes a plurality of transistor devices having diffusion regions and polysilicon gate electrodes, and an oxide material that covers a top surface of the polysilicon gate electrodes of the transistor devices. A silicon nitride layer is also disposed over the semiconductor devices and a dielectric layer is disposed over the silicon nitride layer. The method includes depositing a silicon nitride layer over the dielectric layer, and etching nitride windows in the silicon nitride layer to expose the dielectric layer where conductive contacts to selected polysilicon gate electrodes are desired. The method then includes pattering a photoresist mask over the silicon nitride layer. The photoresist mask is configured to have a plurality of windows defining all contacts to both selected ones of the diffusion regions and selected ones of the polysilicon gate electrodes, and some of the plurality of windows are defined over the nitride windows. Furthermore, the method includes performing a series of dielectric and silicon nitride etch operations to substantially simultaneously form via holes down to selected polysilicon gate electrodes and selected diffusion regions. Once the via holes are etched, a suitable conductive contact fill process may be performed.

22 Claims, 8 Drawing Sheets

METHODS FOR FABRICATING GATE AND DIFFUSION CONTACTS IN SELF-ALIGNED CONTACT PROCESSES

CROSS REFERENCE TO RELATED APPLICATIONS

This application is related to the following U.S. patent application entitled "Fabrication of Gate and Diffusion Contacts in Self-Aligned Contact Process," having U.S. Ser. No. 09/087,492 (attorney docket no. VTI1P196), filed on the same day as the instant application. This application is hereby incorporated by reference.

BACKGROUND OF THE INVENTION

1. Field of the Invention

The present invention relates to the manufacture of semiconductor devices. More particularly, the present invention relates to techniques for improving the fabrication of conductive contacts to gate electrodes and diffusion regions in high performance devices.

2. Description of the Related Art

In fabricating semiconductor devices, semiconductor wafers are placed through a multitude of fabrication operations in order to produce a desired integrated circuit device. As integrated circuit devices continue to shrink, design engineers are continually required to push the limit on existing fabrication techniques. By way of example, when transistor devices are designed with smaller and smaller drain and source diffusion regions, the conductive contacts (i.e., defined through silicon dioxide) that are designed to make electrical links with selected diffusion regions sometimes experience misalignments. Because standard photolithography techniques are now being pushed to their physical limits, these misalignments are expected. Therefore, in order to avoid making an unwanted electrical contact with a gate electrode when a misalignment occurs, a self-aligned contact (SAC) fabrication process has now become common practice. For ease of description, a conventional SAC fabrication process is discussed with reference to FIGS. 1A–1E.

Figure 1A:
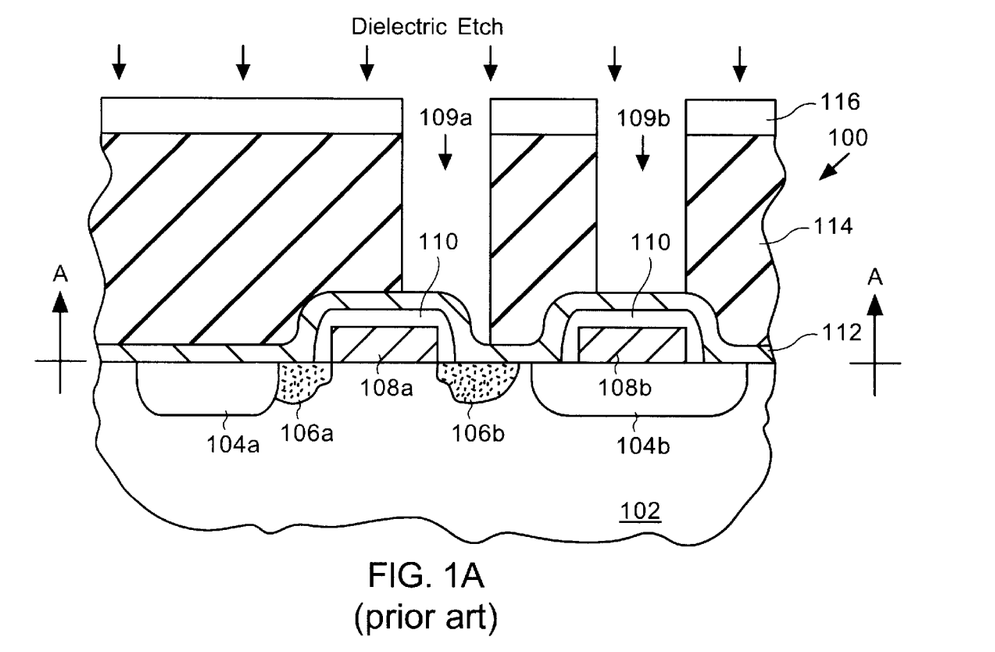
FIG. 1A shows a cross sectional view of a semiconductor substrate having several fabricated layers illustrating a exemplary self-aligned contact (SAC) in accordance with a conventional semiconductor fabrication technique.

FIG. 1A shows a cross sectional view 100 of a semiconductor substrate 102 having several fabricated layers illustrating a exemplary self-aligned contact (SAC) in accordance with a conventional semiconductor fabrication technique. In this example, the semiconductor substrate 102 has two shallow trench isolation regions (STI) 104a and 104b, which are conventionally used to isolate the various semiconductor transistor devices fabricated throughout a semiconductor wafer. Also shown are two transistor devices having polysilicon gates 108a and 108b. The transistor device having polysilicon gate 108a is shown having diffusion regions 106a and 106b which are used to define the source and drain regions of the transistor device. The transistor device having polysilicon gate 108b is shown partially lying over the shallow trench isolation region 104b, which is better defined by a cross section A—A of FIG. 1B.

Figure 1B:
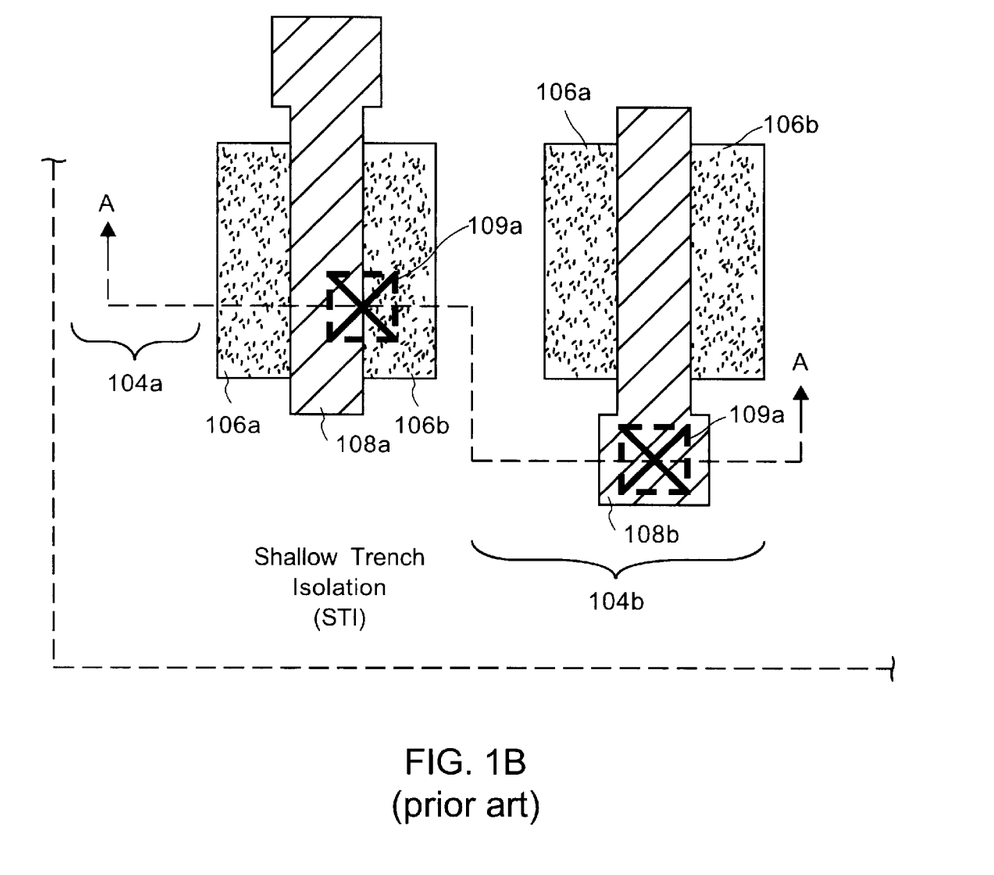
FIG. 1B shows a top view of the cross sectional view of FIG. 1A.

As shown in a top view of FIG. 1B, the polysilicon gate 108b has a contact region in which a contact 109b may be made to the polysilicon gate 108b (i.e., over a poly head). However, the contact 109a is a self-aligned contact (SAC) which enables the formation of a via hole down to the diffusion region 106b without exposing the polysilicon gate 108a. In this example, contact 109a is shown misaligned because the design rules of smaller devices typically causes such misalignments. In contrast, older generation devices had larger geometric sizes, and therefore, the via holes down to the diffusion regions usually did not accidentally misalign over the polysilicon gates and cause circuit malfunctions.

Figure 1C:
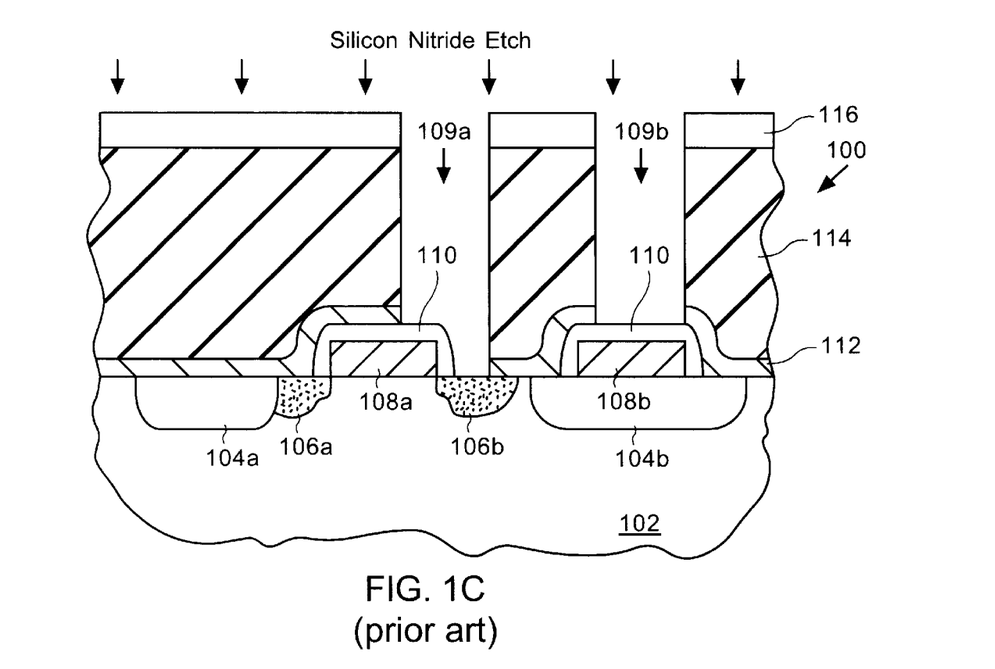
FIG. 1C shows the cross sectional view of FIG. 1A after a silicon nitride etch is performed.

Referring back to FIG. 1A, the polysilicon gates 108a and 108b have an oxide layer 110 defined along the sidewalls and the top surfaces of the polysilicon gates 108. The oxide that remains along the sidewalls of the polysilicon gates 108a and 108b are commonly referred to as oxide spacers. Once the oxide material 110 has been defined, a silicon nitride layer 112 is formed over the semiconductor substrate including over the oxide material 110. Also shown is a dielectric layer 114 that is defined over the silicon nitride layer 112. In order to define the via holes through the dielectric layer 114, a photoresist mask 116 (having expected misalignments) is used to identify the locations where contact 109a and 109b will ultimately reside. After the photoresist mask 116 has been defined, a dielectric etch operation is performed which selectively removes the exposed dielectric material 114 and stops at the silicon nitride layer 112. At this point, a second etching operation is performed (using a different etch chemistry) to etch through the silicon nitride layer 112 as shown in FIG. 1C.

This silicon nitride etch will continue until the exposed silicon nitride layer 112 is removed from within the via holes that define the contact locations 109a and 109b. As shown, the silicon nitride layer will be removed until the oxide material 110 and diffusion region 106b is exposed within the via holes. At this point, a clear path will be made down through the via hole of contact 109a, which defines a path down to the diffusion region 106b (without exposing the polysilicon gate 108a). However, electrical contact is also desired down to the polysilicon gate 108b through the via hole that defines the contact 109b.

Figure 1D:
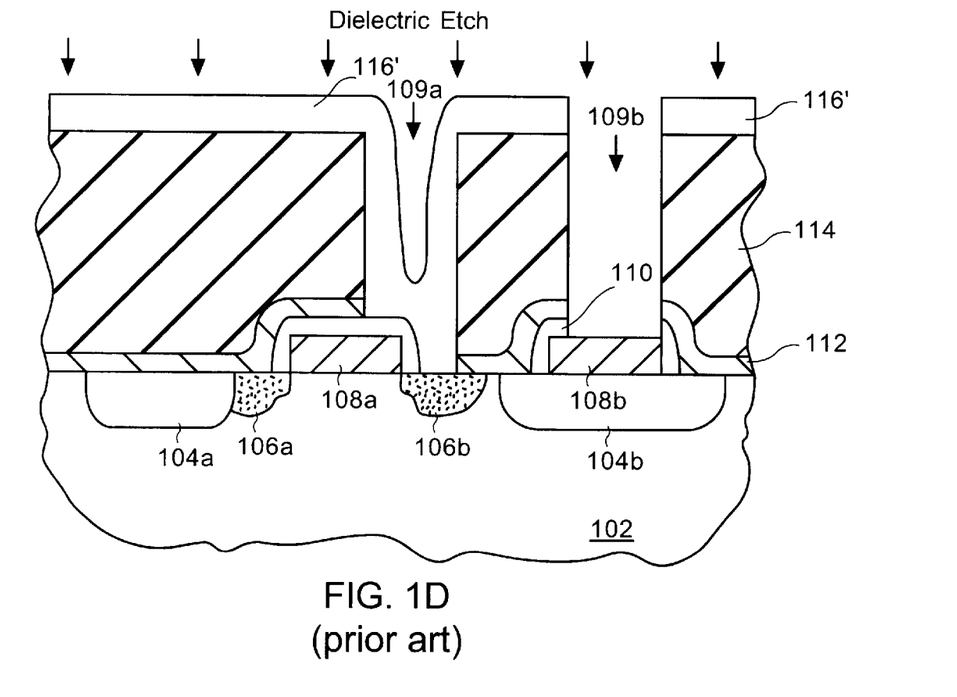
FIG. 1D shows the cross sectional view of FIG. 1C after a dielectric etch is performed.

To accomplish this, a typical prior art approach has been to spin-coat a new photoresist layer 116' over the semiconductor substrate, which substantially fills the via holes that define paths to the contacts 109a and 109b. The photoresist layer 116' is then patterned using a conventional photolithography process which is configured to make the photoresist layer 116' lying over the contact 109b more soluble during a subsequent photoresist development operation (in some cases, photoresist may also become trapped within the via hole of contact 109b). When the photoresist material 116' mask is complete and ready for etching, the via hole of the contact 109a will remain filled with photoresist. Next, a dielectric etch is performed to remove the dielectric material 110 that remains over the polysilicon gate 108b, which will enable subsequent electrical contact to be made when a conductive via is formed in the via hole of contact 109b. Once the dielectric etch is complete and the oxide material 110 is removed from over the polysilicon gate 108b, the photoresist material 116' is stripped.

Figure 1E:
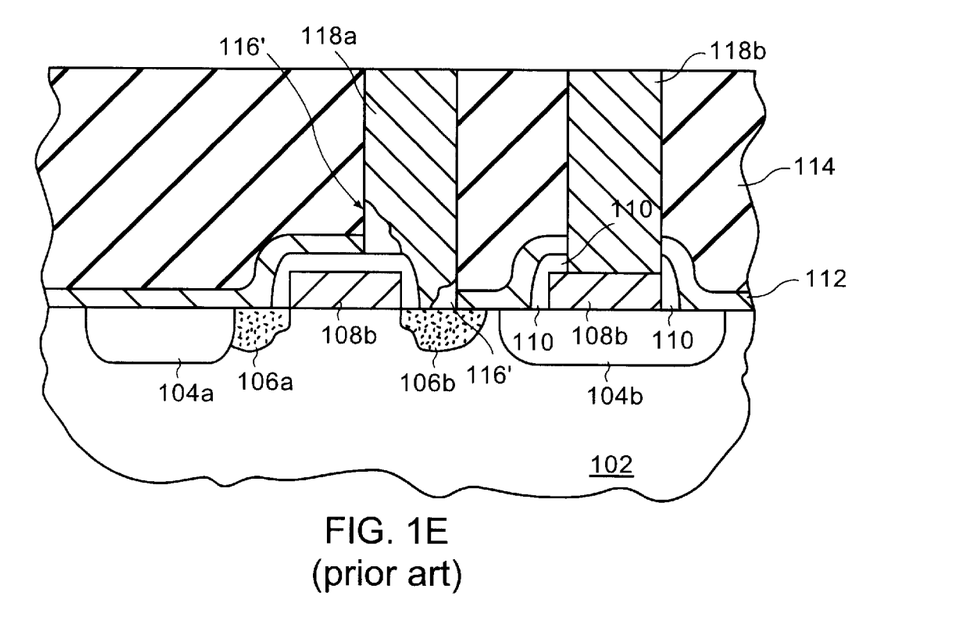
FIG. 1E shows the cross sectional view of FIG. 1D after a conductive fill operation is performed and photoresist residues are trapped within the selected via holes.

Unfortunately, because some via holes such as those of contact 109a are sometimes quite deep (i.e., have large aspect ratios), conventional photoresist stripping operations may inadequately remove all of the photoresist material from within the via holes. As shown in FIG. 1E, a residue of photoresist material 116' remains at the bottom corners (and sometimes over the entire bottom surface) of the via hole of the contact 109a. Hence, the tungsten plugs 118a and 118b defined in the via holes of the contacts 109a and 109b will necessarily suffer by exhibiting high contact resistances and reduced reliability. Furthermore, as demands for smaller integrated circuit devices continue to increase, the contact via holes will exhibit larger aspect ratios which will necessarily make it more likely that photoresist residues will be trapped within via holes. As a result, the conductive contacts throughout an integrated circuit design will exhibit higher resistances that will prevent the device from operating at higher speeds.

In attempts to combat the problem of trapped photoresist residue in via holes, fabrication engineers have been forming the contacts that are made down to the drains and sources, and the polysilicon gates during different fabrication cycles. For example, after the dielectric layer 114 is deposited over the semiconductor substrate 102, only via holes down to the source and drain diffusion regions are made. As mentioned above, the process of making an electrical contact down to the diffusion regions requires utilizing two separate etching operations in order to first etch through the dielectric layer 114 and then through the silicon nitride layer 112. Once those etching operations are complete, the tungsten plugs 118a are formed, and a CMP operation or a tungsten etch-back operation is used to remove the excess tungsten material after filling the contacts down to the diffusion regions.

Once the formation of all of the contacts down to the sources and drains is complete for a particular integrated circuit device, via holes are then defined down to the polysilicon gates 108b. To define this via hole, three separate etching operations are utilized in order to etch though the dielectric layer 114, the silicon nitride layer 112, and then the oxide material 110. Once the formation of these via holes is complete and a path is made down to the polysilicon gate 108b, tungsten plugs 118b are formed. After the tungsten deposition is complete, a CMP operation or tungsten etch-back is again performed in order to remove the excess tungsten material.

Although forming contacts to diffusion regions and gate electrodes during different process cycles may produce more reliable interconnect structures, the number of process operations performed to form all of the contacts is essentially doubled. Furthermore, when a semiconductor wafer is placed through more process operations, the previously formed layers are subjected to processing stresses and heat operations that may introduce reliability reducing side effects, and may therefore reduce yield.

In view of the foregoing, there is a need for methods that improve the fabrication efficiency of conductive contacts made to diffusion regions and transistor gate electrodes throughout a semiconductor integrated circuit device.

SUMMARY OF THE INVENTION

Broadly speaking, the present invention fills these needs by providing improved methods for fabricating conductive contacts down to diffusion regions and transistor gates in self-aligned contact processes. It should be appreciated that the present invention can be implemented in numerous ways, including as a process, an apparatus, a system, a device, or a method. Several inventive embodiments of the present invention are described below.

In one embodiment, a method for making reliable conductive vias in a semiconductor device that is fabricated over a semiconductor wafer is disclosed. The semiconductor device includes a plurality of transistor devices having diffusion regions and polysilicon gate electrodes, and an oxide material that covers a top surface (including sidewalls) of the polysilicon gate electrodes of the transistor devices. A silicon nitride layer is also disposed over the semiconductor devices and then a dielectric layer is disposed over the silicon nitride layer. The method includes depositing a silicon nitride layer over the dielectric layer, and etching nitride windows in the silicon nitride layer to expose the dielectric layer where conductive contacts to selected polysilicon gate electrodes are desired. The method then includes pattering a photoresist mask over the silicon nitride layer. The photoresist mask is configured to have a plurality of windows defining all contacts to both selected ones of the diffusion regions and selected ones of the polysilicon gate electrodes, and some of the plurality of windows are defined over the nitride windows. Furthermore, the method includes performing a series of dielectric and silicon nitride etch operations to substantially simultaneously form via holes down to selected polysilicon gate electrodes and selected diffusion regions. At this point, a suitable conductive contact fill process may be completed.

In another embodiment, a method for manufacturing self-aligned contacts (SAC) is disclosed. The method includes providing a semiconductor substrate having transistor devices that consist of diffusion regions and gate electrodes. The method then includes forming self-aligned contact layers over the semiconductor substrate and depositing a silicon nitride layer over the self-aligned contact layers. Next, the method includes etching nitride windows in the silicon nitride layer to expose the self-aligned contact layers where conductive contacts to selected gate electrodes are desired. After the nitride etching, the method includes pattering a photoresist layer over the silicon nitride layer. The photoresist layer has a plurality of windows defining all contacts to both selected ones of the diffusion regions and selected ones of the gate electrodes, and some of the plurality of windows are defined over the nitride windows. Thereafter, the method includes etching via holes through the plurality of windows and filling the via holes to form conductive contacts.

In yet another embodiment, a method for fabricating conductive contacts through a first intermetal dielectric layer to transistor devices using a self-aligned contact (SAC) process is disclosed. The method includes: (a) forming a silicon nitride mask over the first intermetal dielectric layer, such that the silicon nitride mask has etched windows that identify locations where the conductive contacts to gate electrodes of the transistor devices will be formed; (b) forming a photoresist mask over the silicon nitride mask, and the photoresist mask has a plurality of windows identifying locations where the conductive vias to the gate electrodes and diffusion regions of the transistor devices will be formed; (c) etching via holes through the plurality of windows down to the gate electrodes and the diffusion regions of the transistor devices; and (d) filling the via holes to form the conductive contacts through the first intermetal dielectric layer.

As an advantage, because the conductive vias to both diffusion regions and gate electrodes are made at about the same time, the prior art problem of photoresist trapping can be avoided, which necessarily produces more reliable conductive contacts. In addition, the need to fabricate conductive contacts separately for diffusion regions and then for gate electrodes is also eliminated, thereby reducing the cost fabrication and increasing yield. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for improved methods of fabricating conductive contacts down to diffusion regions and transistor gates in self-aligned contact processes is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2:
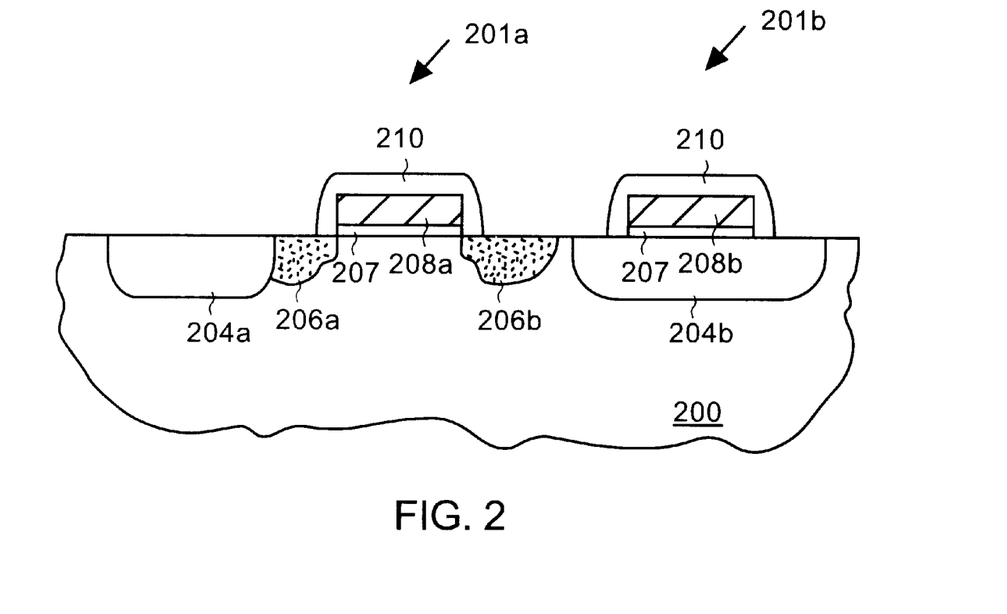
FIG. 2 shows a cross sectional view of a semiconductor substrate having two exemplary transistor structures fabricated thereon.

FIG. 2 shows a cross sectional view of a semiconductor substrate having two exemplary transistor structures 201a and 201b fabricated thereon. In this example, the semiconductor substrate has two shallow trench isolation (STI) regions 204a and 204b which are used to electrically isolate adjacent transistors, and similar STI structures are defined throughout a semiconductor substrate to isolate other respective transistor devices.

The transistor 201a is shown having diffusion regions 206a and 206b which are used to define the source and drain regions of the transistor device. From this cross sectional view, the diffusion regions of the transistor 201b are not shown because the cross section of transistor 201b is being viewed from the polysilicon gate contact region as shown in FIG. 1B above. Each of the transistors 201a and 201b also have a gate oxide 207 and respective polysilicon gates 208a and 208b. Once the polysilicon gates 208a and 208b are formed using conventional deposition and photolithography patterning and etching techniques, an oxide material 210 is deposited over the top of the semiconductor wafer.

Once the deposition of the oxide material is complete, an oxide etching operation is performed until a layer of oxide material 210 remains over the polysilicon gates 208a and 208b. The oxide material that remains along the sidewalls of the polysilicon gates will therefore define well known oxide spacers. The oxide material that remains over the top portion of the polysilicon gates 208a and 208b is commonly used to facilitate the fabrication of self-aligned contacts (SAC). In this embodiment, the oxide material 210 is preferably deposited over the polysilicon gates to a thickness ranging between about 500 angstroms and about 1,500 angstroms, and more preferably between about 750 angstroms and about 1,300 angstroms, and most preferably about 1,000 angstroms.

Figure 3:
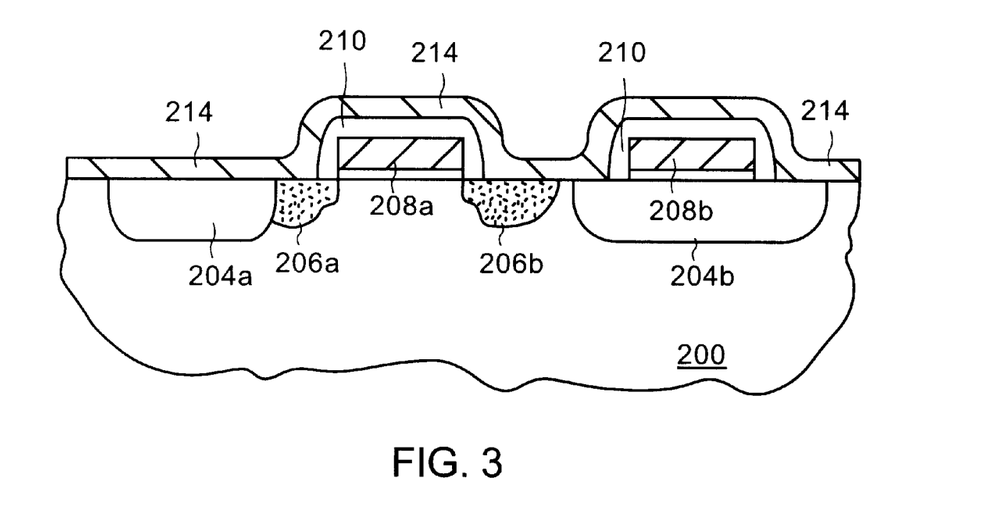
FIG. 3 shows the cross sectional view of FIG. 2 after a silicon nitride layer is deposited in accordance with one embodiment of the present invention.

FIG. 3 shows the cross sectional view of FIG. 2 after a silicon nitride layer 214 is deposited in accordance with one embodiment of the present invention. As shown, the silicon nitride layer 214 is deposited over the entire wafer surface thereby covering shallow trench isolation regions 204 and the oxide material 210 covered polysilicon gates 208. Preferably, the silicon nitride layer 214 is deposited to a thickness ranging between about between about 500 angstroms and about 2,000 angstroms, and more preferably between about 750 angstroms and about 1,250 angstroms, and most preferably about 1,000 angstroms. After the silicon nitride layer 214 has been deposited, a dielectric layer 216 is deposited over the silicon nitride layer 214. Preferably, the dielectric layer 216 is deposited to a thickness ranging between about 5,000 angstroms and about 15,000 angstroms, and more preferably between about 7,000 angstroms and about 10,000 angstroms, and most preferably about 8,000 angstroms.

Now that the dielectric layer 216 is deposited to the desired thickness, another silicon nitride layer 218 is deposited over the dielectric layer 216. In this embodiment, the silicon nitride layer 218 is preferably deposited to a thickness ranging between about 500 angstroms and about 1,500 angstroms, and more preferably between about 600 angstroms and about 1,000 angstroms, and most preferably about 750 angstroms. At this point, a photoresist mask 219 is spin-coated and patterned over the silicon nitride layer 218 as shown if FIG. 4. Preferably, the photoresist mask 219 is patterned in a manner that exposes windows 220 over the locations where vias down to the polysilicon gates 208b will be subsequently formed.

Figure 4:
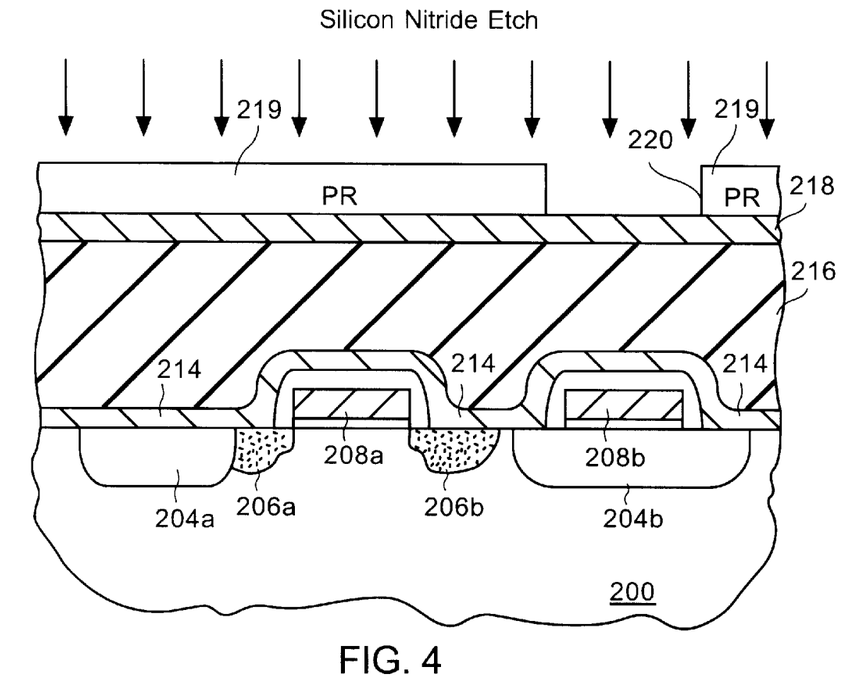
FIG. 4 shows the cross sectional view of FIG. 3 after a photoresist mask is spin-coated and patterned over the silicon nitride layer in accordance with one embodiment of the present invention.

To automate the identification of the window locations 220 throughout an integrated circuit device, an automated design tool is used to quickly analyze and compare design layer masks. As is well known, each design layer is typically stored as a digital data file that identifies the X and Y coordinates of the various features that lie on each design layer. In one embodiment of the present invention, a mask generator software layout tool that empowers designers to perform numerous logical operations, such as, AND operations, OR operations, XOR operations, etc., between the digital data of two design layer masks is used. One exemplary mask generation tool is a product named CATS (computer aided transcription system), which is made by Transcription Enterprises, L.T.D., of Los Gatos, Calif.

In this embodiment, a logical AND operation may be performed between a digital file containing the layout geometries for the polysilicon gates 208b and a digital file containing the layout geometries for all of the contact locations throughout the integrated circuit device. In this manner, a reticle mask pattern having the windows 220 that is used to pattern the photoresist mask 219 will be produced.

Figure 5:
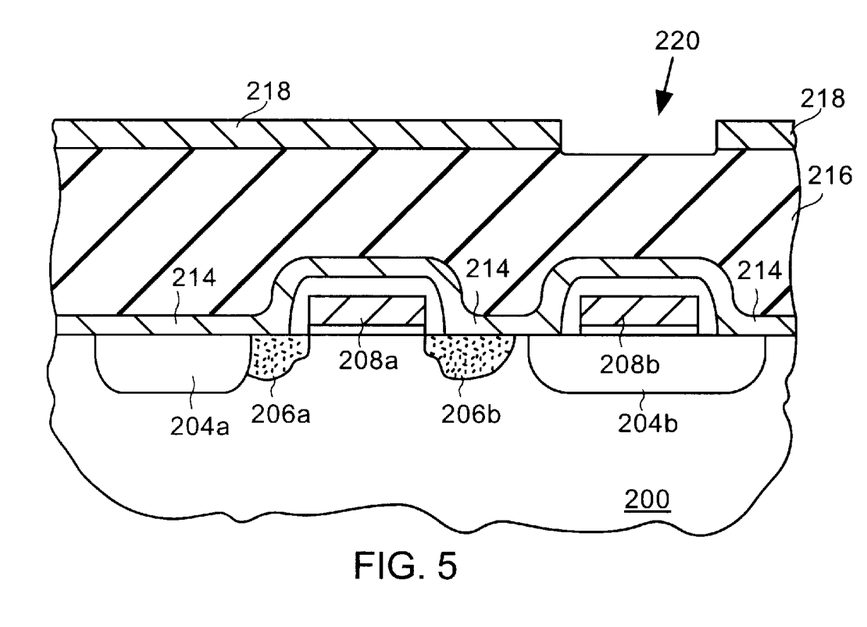
FIG. 5 shows the cross sectional view of FIG. 4 after the silicon nitride layer has been etched to define windows exposing a dielectric layer in accordance with one embodiment of the present invention.

Now that the windows 220 have been patterned to form the photoresist mask 219, a silicon nitride etch will be performed to remove the exposed silicon nitride material 218 within the windows 220. Upon completing the silicon nitride etch, the photoresist mask 219 will be stripped leaving the structure shown in FIG. 5. In this preferred embodiment, the etching through the silicon nitride layer 218 will preferably be performed using the etching chemistries and conditions illustrated in table A below.

overetch will only etch about 250 angstroms of dielectric material 216 (i.e., 750/3=250).

Figure 6:
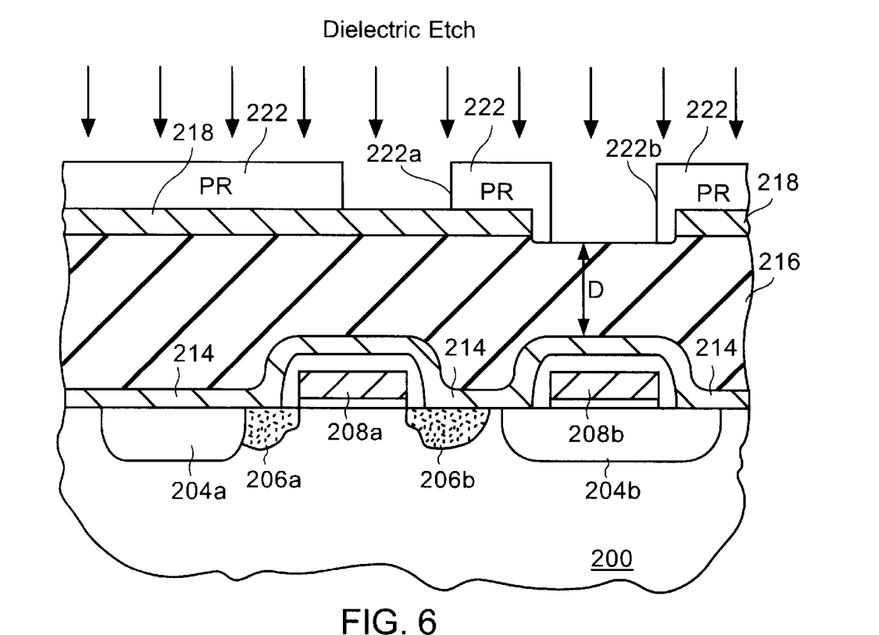
FIG. 6 shows the cross sectional view of FIG. 5 after a photoresist mask is formed over the patterned silicon nitride layer in accordance with one embodiment of the present invention.

FIG. 6 shows the cross sectional view of FIG. 5 after a photoresist mask 222 has been spin-coated and patterned, using standard photolithography operations, over the surface of the silicon nitride layer 218 and exposed regions of the dielectric layer 216. In this embodiment, the photoresist mask 222 will preferably be patterned with the entire contact location mask, which will define exemplary window 222a over diffusion region 206b, and exemplary window 222b over the polysilicon gate 208b. Once the photoresist mask 222 has been patterned, a dielectric etch operation is performed. In this embodiment, the dielectric etch operation is performed such that the dielectric material 216 along a via hole path over the polysilicon gate 208b will be etched until the surface of the silicon nitride layer 214 is exposed.

In one exemplary embodiment, assume that the depth "D" is about 5,500 angstroms between the top surface of the dielectric layer 216 within the window 222b and the top surface of the silicon nitride layer 214 over the polysilicon gate 208b. In view of this assumption, the dielectric etch operation will be performed such that about a 50 percent overetch operation is performed. In this manner, approximately 8,500 angstroms of the dielectric material 216 will be etched in order to compensate for topographical variations throughout the integrated circuit device.

Figure 7:
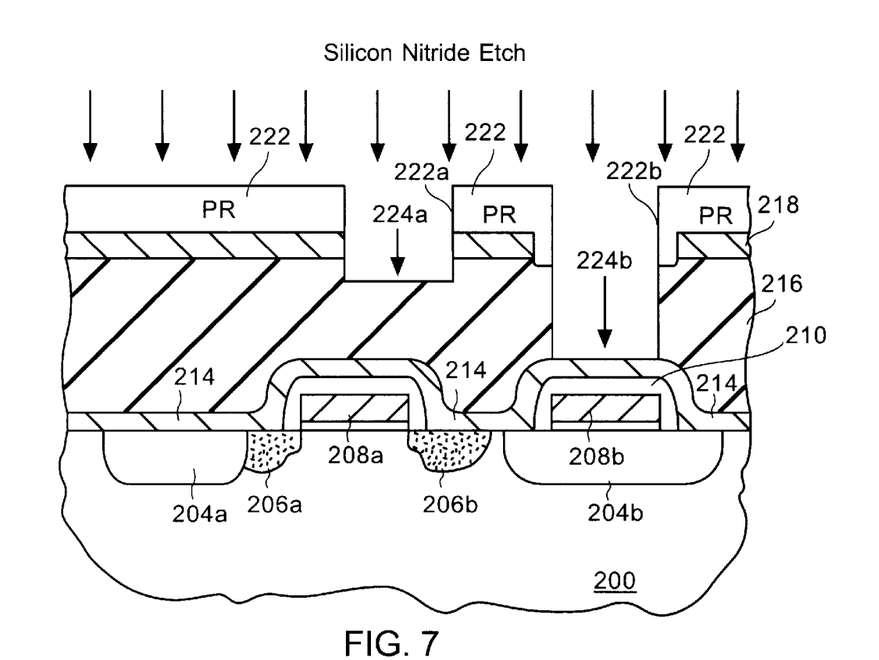
FIG. 7 shows the cross sectional view of FIG. 6 after a dielectric etch is performed in accordance with one embodiment of the present invention.

During this dielectric etch, a complete via hole 224b will be defined down to the silicon nitride layer 214 as shown in

TABLE A

Silicon Nitride $CHF_3/O_2$
Etch Chemistry

| | Top Power watts | Bottom Power watts | Flow Rates SCCM | | Pressure mTorr | (He) backside pressure Torr |
|---|---|---|---|---|---|---|
| Preferred Range | 100–300 | 50–200 | $CHF_3$ 1–20 | $O_2$ 20–100 | 100–300 | 5–20 |
| More Preferred Range | 150–250 | 75–125 | $CHF_3$ 2–10 | $O_2$ 30–60 | 150–250 | 7–13 |
| Most Preferred | 200 | 100 | $CHF_3$ 5 | $O_2$ 45 | 200 | 10 |

In order to ensure that the silicon nitride material 218 has been removed from within the window 220, and overetch of about 100 percent is used to clear all of the exposed silicon nitride material. As used herein, the total etch time lapsed during an etch operation is 100 percent, and a 100 percent overetch essentially doubles the time spent during etching. Similarly, any other percentage overetch is also measured relative to an actual 100 percent etch time.

In this embodiment, due to experimentally determined etch rate selectivities, the etching chemistries used to etch through the silicon nitride material 218 will only etch through the dielectric layer 216 at about one-third the rate of silicon nitride. As a result, when about 750 angstroms of the silicon nitride layer 218 is etched, a subsequent 100 percent FIG. 7. Because the selectivity of dielectric/silicon nitride (i.e., $SiO_2/SiN=10$) is about 10, only about 850 angstroms of silicon nitride will be etched while the approximate 8,500 angstroms of the dielectric is etched. Because of this selectivity, all of the silicon nitride layer 218 within the window 222a will be removed and a portion of the dielectric layer 216 will also be removed as shown in FIG. 7, thereby producing via hole 224a. In addition, the dielectric etch operation will also remove all of the dielectric material in the via hole 224b leading down to the polysilicon gate 208b. In one embodiment of the present invention, the etching through the dielectric layers, such as dielectric layer 216, will preferably be performed using the etching chemistries and conditions illustrated in table B below.

TABLE B

Dielectric (SiO$_2$) Ar/CF$_4$/CO/C$_4$F$_8$
Etch Chemistry

| | Top Power watts | Bottom Power watts | Flow Rates SCCM | | | | Pressure mTorr | (He) backside pressure Torr |
|---|---|---|---|---|---|---|---|---|
| Preferred Range | 400–1200 | 500–1500 | Ar 150–500 | CF$_4$ 1–8 | CO 50–300 | C$_4$F$_8$ 1–8 | 25–150 | 5–30 |
| More Preferred Range | 600–1000 | 800–1200 | Ar 250–350 | CF$_4$ 1–5 | CO 100–200 | C$_4$F$_8$ 1–5 | 40–80 | 10–20 |
| Most Preferred | 800 | 1000 | Ar 300 | CF$_4$ 2 | CO 150 | C$_4$F$_8$ 2 | 15 | |

Figure 8:
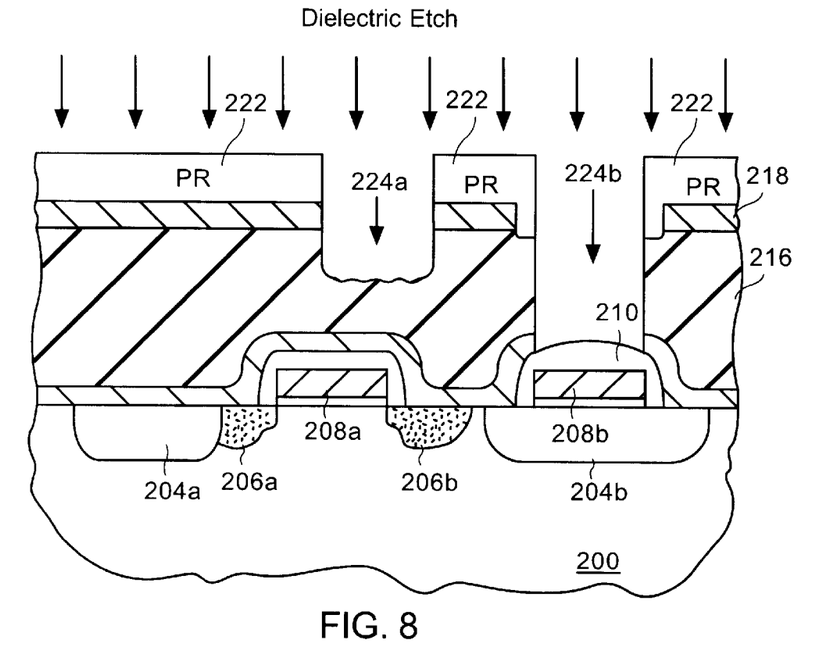
FIG. 8 shows the cross section view of FIG. 7 after a silicon nitride etch is performed in accordance with one embodiment of the present invention.

At this point, another silicon nitride etch operation using the conditions of table A is performed in order to remove the silicon nitride material 214 lying over the polysilicon gate 208b in via hole 224b. During this silicon nitride etch operation, if the thickness of the silicon nitride layer 214 is about 750 angstroms, an approximate 100 percent overetch is performed in order to ensure that all of the silicon nitride material 214 is removed from over the oxide material 210. During this 100 percent overetch operation, about 500 angstroms of dielectric material from within the via hole 224a may be removed. Now that the silicon nitride material 214 has been removed from within the via hole 224b, a dielectric etch is performed as shown in FIG. 8 using the etch chemistries of table B.

Figure 9:
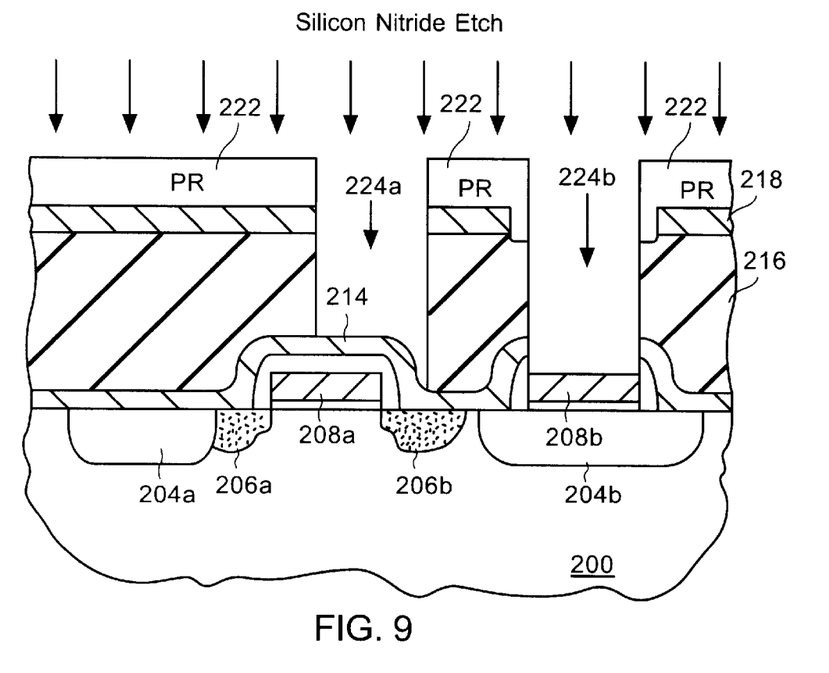
FIG. 9 shows the cross sectional view of FIG. 8 after a dielectric etch is performed in accordance with one embodiment of the present invention.

The dielectric etch in this embodiment is configured to remove the dielectric material 216 from over the diffusion region 206b and the oxide material 210 from within the via hole 224b. This dielectric etch will therefore continue until the silicon nitride material 214 is reached within via hole 224a and the polysilicon gate 208b is exposed. At this point, a silicon nitride etch is performed in order to remove the silicon nitride material 214 from within the via hole 224a as shown in FIG. 9.

Figure 10:
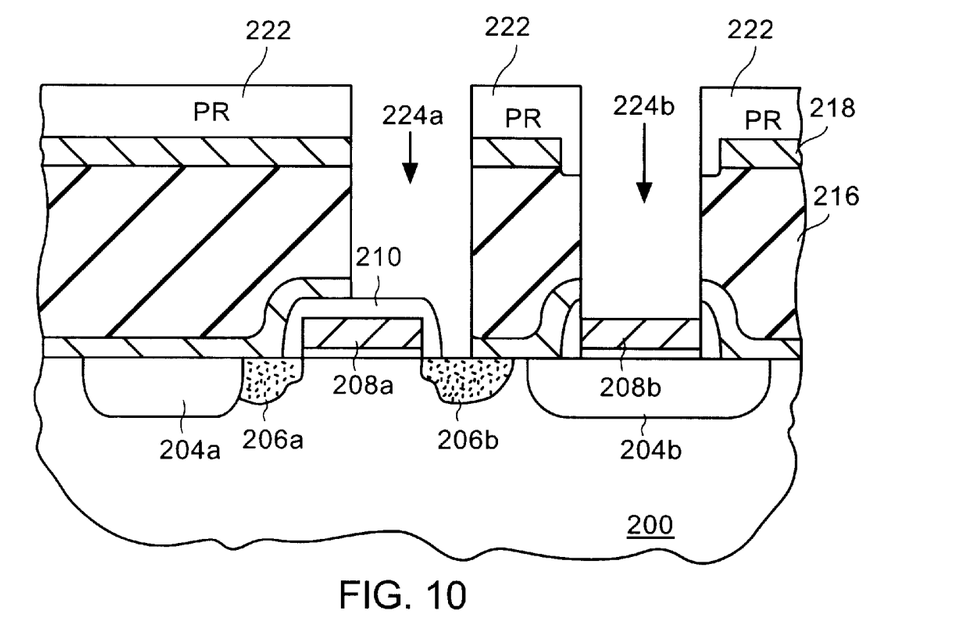
FIG. 10 shows the cross sectional view of FIG. 9 after a silicon nitride etch is performed in accordance with one embodiment of the present invention.

Because the silicon nitride etch does not remove much of the polysilicon gate 208b, it is possible to remove all of the silicon nitride material 214 from within the via hole 224a. The silicon nitride etch will therefore continue until all the silicon nitride material 214 is removed and the oxide material 210 and diffusion region 206b is exposed as shown in FIG. 10. At this stage, the exemplary via holes 224a and 224b will be complete down to the diffusion region 206b and polysilicon gate 208b. Of course, it should be understood that these two via holes are merely exemplary via holes, and many more via holes to other polysilicon gates 208b and other diffusion regions 206 will be made at about the same time throughout a semiconductor wafer using the above described method.

Figure 11:
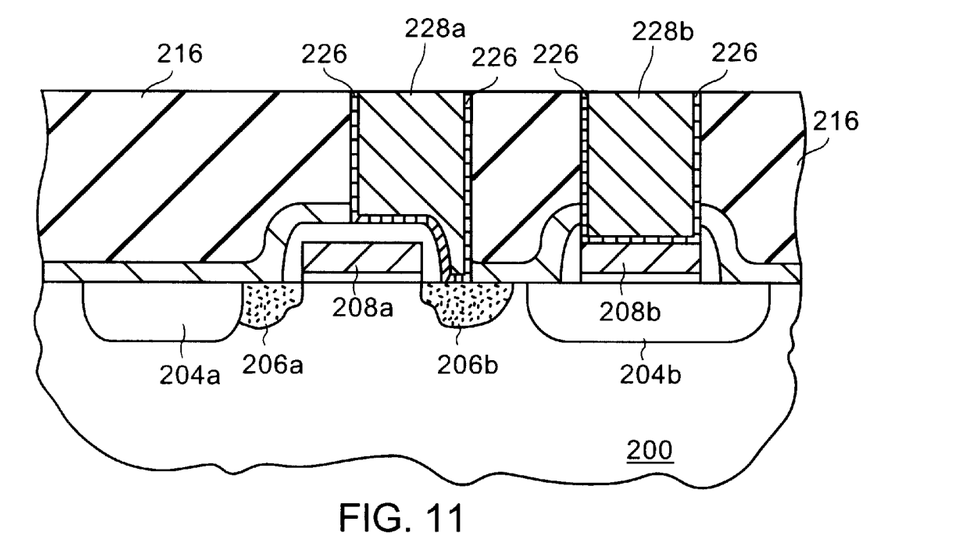
FIG. 11 shows the cross sectional view of FIG. 10 after a conductive fill operation is performed in order to define reliable self-aligned contacts in accordance with one embodiment of the present invention.

Now that the via holes 224a and 224b are complete, the photoresist mask 222 is stripped. A titanium nitride barrier layer 226 is now deposited over the silicon nitride material 218 and within the via holes 224a and 224b. A tungsten deposition is then performed in order to fill the via holes with a tungsten material to form tungsten plugs. Upon completing the tungsten fill operation, a chemical mechanical polishing (CMP) operation (or etchback operation) is performed in order to remove the excess tungsten material, titanium nitride layer, and the silicon nitride material 218. FIG. 11 now shows completely formed tungsten plugs 228a and 228b which are formed within the via holes 224a and 224b.

As can be appreciated, the resulting via holes down to diffusion regions 206 and polysilicon gates 208 throughout an integrated circuit device will be more reliable because photoresist is not trapped within the conductive contacts and therefore, the resistance will not be uncontrollably increased.

It should now be evident that via holes made down to the diffusion regions and to polysilicon gates may be made at about the same time without requiring separate and duplicative processing operations to form the via holes down to diffusion regions, and then performing all of the same process steps again to make the via holes down to the selected polysilicon gate contact locations. In addition, it should also be evident that there is no need to spin-coat photoresist materials into via holes where they may become trapped.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making reliable conductive vias in a semiconductor device that is fabricated over a semiconductor wafer, the semiconductor device includes a plurality of transistor devices having diffusion regions and polysilicon gate electrodes, an oxide material is configured to cover a top surface of the polysilicon gate electrodes of the transistor devices, a silicon nitride layer is disposed over the semiconductor devices and a dielectric layer is disposed over the silicon nitride layer, the method comprising:

depositing a silicon nitride layer over the dielectric layer;

etching nitride windows in the silicon nitride layer to expose the dielectric layer where conductive contacts to selected polysilicon gate electrodes are desired;

patterning a photoresist mask over the silicon nitride layer, the photoresist mask having a plurality of windows defining all contacts to both selected ones of the diffusion regions and selected ones of the polysilicon gate electrodes, wherein some of the plurality of windows are defined over the nitride windows; and performing a series of dielectric and silicon nitride etch operations to substantially simultaneously form via holes down to selected polysilicon gate electrodes and selected diffusion regions.

2. A method for making reliable conductive vias as recited in claim 1, wherein the series of dielectric and silicon nitride etch operations comprises:

performing a first dielectric etch through the photoresist mask;

performing a first silicon nitride etch through the photoresist mask;

performing a second dielectric etch through the photoresist mask; and performing a second silicon nitride etch through the photoresist mask.

3. A method for making reliable conductive vias as recited in claim 2, wherein performing the first dielectric etch comprises:

etching the dielectric material within the nitride windows and the silicon nitride layer within the plurality of windows other than within the nitride windows.

4. A method for making reliable conductive vias as recited in claim 2, wherein performing the first silicon nitride etch comprises:

etching the silicon nitride layer over the oxide material that is over the polysilicon gate electrodes that lie under the nitride windows.

5. A method for making reliable conductive vias as recited in claim 2, wherein performing the second dielectric etch comprises:

etching the oxide material that is over the polysilicon gate electrodes that lie under the nitride windows and the oxide material under the plurality of windows other than within the nitride windows.

6. A method for making reliable conductive vias as recited in claim 2, wherein performing the second silicon nitride etch comprises:

etching the silicon nitride layer under the plurality of windows other than within the nitride windows, thereby exposing selected ones of the diffusion regions.

7. A method for making reliable conductive vias as recited in claim 2, further comprising:

filling the via holes down to selected polysilicon gate electrodes and selected diffusion regions.

8. A method for making reliable conductive vias as recited in claim 7, wherein the filling comprises:

depositing a barrier layer; and depositing a tungsten layer.

9. A method for making reliable conductive vias as recited in claim 8, further comprising:

performing a chemical mechanical polishing operation to remove a portion of the tungsten layer and barrier layer over the silicon nitride layer that is over the dielectric layer, and continuing the chemical mechanical polishing to remove the silicon nitride layer that is over the dielectric layer, thereby forming reliable conductive contacts.

10. A method for manufacturing self-aligned contacts (SAC), comprising: providing a semiconductor substrate having transistor devices that consist of diffusion regions and gate electrodes;

forming self-aligned contact layers over the semiconductor substrate;

depositing a silicon nitride layer over the self-aligned contact layers;

etching nitride windows in the silicon nitride layer to expose the self-aligned contact layers where conductive contacts to selected gate electrodes are desired;

pattering a photoresist layer over the silicon nitride layer, the photoresist layer having a plurality of windows defining all contacts to both selected ones of the diffusion regions and selected ones of the gate electrodes, wherein some of the plurality of windows are defined over the nitride windows;

etching via holes through the plurality of windows; and filling the via holes to form conductive contacts.

11. A method for manufacturing self-aligned contacts (SAC) as recited in claim 10, wherein the forming of self-aligned contact layers over the semiconductor substrate comprises:

forming an oxide material over a top surface of the gate electrodes of the transistor devices;

forming a silicon nitride layer over the transistor devices including the oxide material; and forming a dielectric layer over the silicon nitride layer.

12. A method for manufacturing self-aligned contacts (SAC) as recited in claim 11, wherein the etching via holes through the plurality of windows comprises:

performing a series of dielectric and silicon nitride etch operations to simultaneously form via holes down to selected gate electrodes and selected diffusion regions.

13. A method for manufacturing self-aligned contacts (SAC) as recited in claim 12, wherein the series of dielectric and silicon nitride etch operations comprises:

performing a first dielectric etch through the patterned photoresist layer;

performing a first silicon nitride etch through the patterned photoresist layer;

performing a second dielectric etch through the patterned photoresist layer; and performing a second silicon nitride etch through the patterned photoresist layer.

14. A method for manufacturing self-aligned contacts (SAC) as recited in claim 13, wherein performing the first dielectric etch comprises:

etching the dielectric material within the nitride windows and the silicon nitride layer within the plurality of windows other than within the nitride windows.

15. A method for manufacturing self-aligned contacts (SAC) as recited in claim 13, wherein performing the first silicon nitride etch comprises:

etching the silicon nitride layer over the oxide material that is over the gate electrodes that lie under the nitride windows.

16. A method for manufacturing self-aligned contacts (SAC) as recited in claim 13, wherein performing the second dielectric etch comprises:

etching the oxide material that is over the gate electrodes that lie under the nitride windows and the oxide material under the plurality of windows other than within the nitride windows.

17. A method for manufacturing self-aligned contacts (SAC) as recited in claim 13, wherein performing the second silicon nitride etch comprises:

etching the silicon nitride layer under the plurality of windows other than within the nitride windows, thereby exposing selected ones of the diffusion regions.

18. A method for manufacturing self-aligned contacts (SAC) as recited in claim 10, wherein the filling of the via holes to form conductive contacts further comprises:

depositing a barrier layer; and depositing a tungsten layer.

19. A method for manufacturing self-aligned contacts (SAC) as recited in claim 18, further comprising:

performing a chemical mechanical polishing operation to remove a portion of the tungsten layer and barrier layer over the silicon nitride layer that is over the dielectric layer, and continuing the chemical mechanical polishing to remove the silicon nitride layer that is over the dielectric layer, thereby forming reliable conductive contacts.

20. A method for fabricating conductive contacts through a first intermetal dielectric layer to transistor devices using a self-aligned contact (SAC) process, comprising:

forming a silicon nitride mask over the first intermetal dielectric layer, the silicon nitride mask having etched windows that identify locations where the conductive contacts to gate electrodes of the transistor devices will be formed;

forming a photoresist mask over the silicon nitride mask, the photoresist mask having a plurality of windows identifying locations where the conductive vias to the gate electrodes and diffusion regions of the transistor devices will be formed;

etching via holes through the plurality of windows down to the gate electrodes and the diffusion regions of the transistor devices; and filling the via holes to form the conductive contacts through the first intermetal dielectric layer.

21. A method for fabricating conductive contacts through a first intermetal dielectric layer to transistor devices using a self-aligned contacts (SAC) process as recited in claim 20, wherein etching via holes comprises:

performing a series of dielectric and silicon nitride etch operations to substantially simultaneously form the via holes down to selected gate electrodes and selected diffusion regions.

22. A method for fabricating conductive contacts through a first intermetal dielectric layer to transistor devices using a self-aligned contacts (SAC) process as recited in claim 21, wherein the series of dielectric and silicon nitride etch operations comprises:

performing a first dielectric etch through the photoresist mask;

performing a first silicon nitride etch through the photoresist mask;

performing a second dielectric etch through the photoresist mask; and performing a second silicon nitride etch through the photoresist mask.

* * * * *